US012645114B2

(12) United States Patent
Yueh et al.

(10) Patent No.: US 12,645,114 B2
(45) Date of Patent: Jun. 2, 2026

(54) DISPLAY DEVICE INCLUDING LIGHT EMITTING UNITS EMITTING THE SAME COLOR

(71) Applicant: Innolux Corporation, Miaoli County (TW)

(72) Inventors: Jui-Jen Yueh, Miaoli County (TW); Kuan-Feng Lee, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 50 days.

(21) Appl. No.: 18/590,953

(22) Filed: Feb. 29, 2024

(65) Prior Publication Data

US 2024/0203955 A1      Jun. 20, 2024

Related U.S. Application Data

(63) Continuation of application No. 17/585,572, filed on Jan. 27, 2022, now Pat. No. 11,948,923, which is a (Continued)

(30) Foreign Application Priority Data

Jul. 16, 2019    (CN) .......................... 201910638195.5

(51) Int. Cl.
*G02F 1/13*          (2006.01)
*G02F 1/13357*          (2006.01)
(Continued)

(52) U.S. Cl.
CPC ..... *G02F 1/133603* (2013.01); *H10H 20/851* (2025.01); *H10H 29/142* (2025.01); (Continued)

(58) Field of Classification Search
CPC ......... G02F 1/133603; G02F 1/133614; G02F 1/13336; G02F 1/133611; H01L 25/0655; (Continued)

(56) References Cited

U.S. PATENT DOCUMENTS 6,344,887 B1 * 2/2002 Ma ....................... G02F 1/13718
                                                        349/98
9,681,515 B2 * 6/2017 Rantala .................... A01G 9/20
(Continued)

FOREIGN PATENT DOCUMENTS

CA          3072121 A1 *  3/2019    ............ A61M 21/00
KR      20170128267      11/2017
KR      20190072965        6/2019

OTHER PUBLICATIONS

"Office Action of Korea Counterpart Application", issued on Aug. 20, 2024, p. 1-p. 5.

*Primary Examiner* — Ida M Soward
(74) *Attorney, Agent, or Firm* — JCIPRNET

(57)          ABSTRACT

A display device includes a first light emitting unit, a first optical portion, a second light emitting unit and a second optical portion. The first optical portion disposed on the first light emitting unit, wherein a light emitting from the first light emitting unit at least passes through the first optical portion is a first light, and the first light includes a first main-peak. The second optical portion disposed on the second light emitting unit, wherein a light emitting from the second light emitting unit at least passes through the second optical portion is a second light, and the second light includes a second main-peak, wherein a first wavelength difference between the first main-peak and the second main-peak is less than 20 nm, and the first light and the second light are same color light.

8 Claims, 7 Drawing Sheets

Related U.S. Application Data continuation of application No. 16/905,924, filed on Jun. 19, 2020, now Pat. No. 11,264,364.

(51) Int. Cl.

| | |
|---|---|
| *H10H 20/851* | (2025.01) |
| *H10H 29/14* | (2025.01) |
| *H10K 59/18* | (2023.01) |
| *H10K 59/35* | (2023.01) |
| *H10K 59/38* | (2023.01) |
| *H10K 59/80* | (2023.01) |
| *H10K 59/90* | (2023.01) |
| *H10W 90/00* | (2026.01) |

(52) U.S. Cl.
CPC ............. *H10K 59/18* (2023.02); *H10K 59/35* (2023.02); *H10K 59/38* (2023.02); *H10K 59/875* (2023.02); *H10K 59/90* (2023.02); *H10W 90/00* (2026.01); *G09G 2300/0452* (2013.01); *H10H 20/8512* (2025.01); *H10K 59/351* (2023.02); *H10K 59/352* (2023.02)

(58) Field of Classification Search
CPC .............. H01L 25/0753; H10H 20/851; H10H 20/8512; H10H 20/8513; H10H 29/142; H10K 59/18; H10K 59/35; H10K 59/38; H10K 59/875; H10K 59/90; H10K 59/351; H10K 59/352; H10K 59/121; H10K 59/126; G09G 3/2074; H10W 90/00

See application file for complete search history.

(56)                References Cited

U.S. PATENT DOCUMENTS

| | | | | |
|---|---|---|---|---|
| 10,073,294 | B1 * | 9/2018 | Lin ................... | G02F 1/133514 |
| 10,115,872 | B2 * | 10/2018 | Kato ................... | H10H 20/8513 |
| 10,401,682 | B2 * | 9/2019 | Lin ................... | G02F 1/133617 |
| 10,448,579 | B2 * | 10/2019 | Casper ..................... | F21V 9/08 |
| 12,007,650 | B2 * | 6/2024 | David .............. | G02F 1/133553 |
| 2006/0126326 | A1 * | 6/2006 | Ng ............................ | F21K 9/00 |
| | | | | 348/E5.029 |
| 2007/0045648 | A1 * | 3/2007 | Lin ..................... | H01L 25/0753 |
| | | | | 257/E25.02 |
| 2007/0284994 | A1 * | 12/2007 | Morimoto .............. | H05B 33/14 |
| | | | | 313/483 |
| 2013/0070448 | A1 * | 3/2013 | Galvez ..................... | F21V 9/38 |
| | | | | 362/230 |
| 2014/0034991 | A1 * | 2/2014 | McKenzie ............ | H05B 45/20 |
| | | | | 438/27 |
| 2017/0014022 | A1 * | 1/2017 | Tamura .............. | G02B 23/2469 |
| 2019/0064515 | A1 * | 2/2019 | Wei ................... | G02F 1/133512 |
| 2020/0091248 | A1 * | 3/2020 | Lin ........................ | H10K 59/35 |
| 2021/0098730 | A1 * | 4/2021 | Wu ........................ | H10K 50/13 |

* cited by examiner

DISPLAY DEVICE INCLUDING LIGHT EMITTING UNITS EMITTING THE SAME COLOR

CROSS-REFERENCE TO RELATED APPLICATION

This application is a continuation application of and claims the priority benefit of U.S. application Ser. No. 17/585,572, filed on Jan. 27, 2022. The prior U.S. application Ser. No. 17/585,572 is a continuation application of and claims the priority benefit of U.S. application Ser. No. 16/905,924, filed on Jun. 19, 2020, which claims the priority benefit of China application serial no. 201910638195.5, filed on Jul. 16, 2019. The entirety of each of the above-mentioned patent applications is hereby incorporated by reference herein and made a part of this specification.

BACKGROUND

Technical Field

The disclosure relates to an electronic device, and more particularly to a display device.

Description of Related Art

The recognition of color difference of different colors by the human eyes is different due to differences in colors. For example, blue color difference is easier to be perceived by the human eyes than red color difference and green color difference. A display device may use three primary colors of light for light mixing to provide a display screen. When there is a color difference perceivable by the human eyes between different sub-pixels of the same color (such as different blue sub-pixels) in the display device, the visual effect (display quality) of the display device will be affected.

SUMMARY

The disclosure provides a display device having good display quality.

According to the embodiments of the disclosure, the display device comprises a first sub-pixel and a second sub-pixel. The first sub-pixel comprises a first light emitting unit and a first wavelength conversion layer disposed thereon. The first sub-pixel provides a first light emitted from the first light emitting unit and converted by the first wavelength conversion layer. The first light comprises a first main-peak and a first sub-peak. The second sub-pixel comprises a second light emitting unit and a second wavelength conversion layer disposed thereon. The second sub-pixel provides a second light emitted from the second light emitting unit and converted by the second wavelength conversion layer. The second light includes a second main-peak and a second sub-peak. A first wavelength difference between the first main-peak and the second main-peak is less than 20 nanometers (nm). The first wavelength difference is less than a second wavelength difference between the first sub-peak and the second sub-peak.

To make the aforementioned and other features of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate example of the invention and, together with the description, serve to explain the principles of the invention.

DETAILED DESCRIPTION OF DISCLOSED EMBODIMENTS

Figure 1:
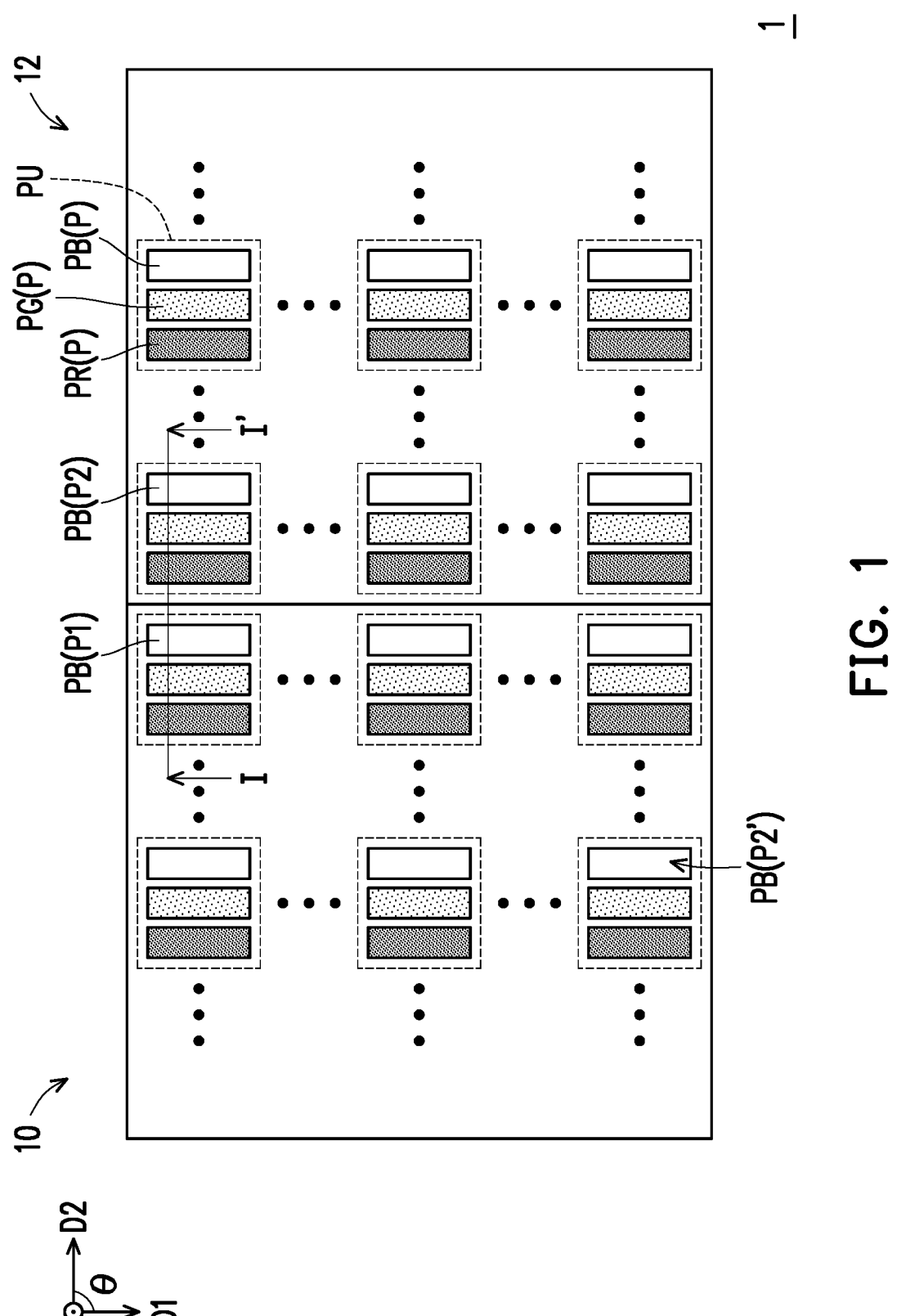
FIG. 1 is a front view of a display device according to the first embodiment of the disclosure.

The disclosure may be understood by referring to the following detailed descriptions in conjunction with the accompanying drawings. It should be noted that in order for the reader to understand easily and for the simplicity of the drawings, multiple drawings in the disclosure only illustrate a portion of the electronic device and specific elements in the drawings are not drawn to scale. In addition, the number and size of each element in the drawings are only for illustration and are not intended to limit the scope of the disclosure.

Certain terms are used throughout the disclosure and the appended claims to refer to specific elements. Persons skilled in the art should understand that electronic equipment manufacturers may refer to the same elements using different names. The disclosure is not intended to distinguish between the elements with the same function but different names. In the following specification and claims, words such as "having" and "including" are open-ended words, which should be interpreted as the meaning of "including but not limited to . . . ".

Directional terms such as "up", "down", "front", "rear", "left", "right", etc., as mentioned in the disclosure only refer to directions with reference to the drawings. Therefore, the directional terms are only for illustration and are not intended to limit the disclosure. In the drawings, the drawings illustrate general characteristics of methods, structures, and/or materials used in specific embodiments. However, the drawings should not be construed to define or limit the scope or nature covered by the embodiments. For example, for clarity, the relative size, thickness, and location of each film layer, region, and/or structure may be reduced or enlarged.

It should be understood that when an element or film layer is referred to as being configured "on" or "connected" to another element or film layer, the former may be directly on or directly connected to the other element or film layer or there may be an intervening element or film layer between the two (indirect case). In contrast, when an element is referred to as being "directly on" or "directly connected" to another element or film layer, there is no intervening element or film layer between the two.

The term "approximately", "equal to", "equal", or "same" typically represents falling within a 20% range of a given value or range, or represents falling within a 10%, 5%, 3%, 2%, 1%, or 0.5% range of a given value or range.

In the disclosure, the same or similar elements will be given the same or similar reference numerals, and detailed descriptions thereof will be omitted. In addition, as long as the features in different embodiments do not violate the spirit of the disclosure and are not mutually conflicting, they may be mixed and used arbitrarily. Also, all simple equivalent changes and modifications made according to the specification or claims fall within the scope of the disclosure. In addition, terms such as "first", "second", etc. mentioned in the specification or claims are only used to name discrete elements or to distinguish different embodiments or ranges, but not to limit the upper limit or lower limit of the number of elements and the manufacturing sequence or configurational sequence of the elements.

The electronic device of the disclosure may include a display device, an antenna device, a sensing device, a light emitting device or a splicing device, but is not limited thereto. The electronic device may include a bendable or flexible electronic device. The electronic device may include, for example, a liquid crystal layer or a light emitting diode (LED). The LED may include, for example, an organic light emitting diode (OLED), a mini LED, a micro LED, or a quantum dot LED (abbreviated as QLED or QDLED), fluorescence, phosphor, other suitable materials or a combination thereof, but is not limited thereto. A display device is used as the electronic device in the following to explain the content of the disclosure, but it is not limited thereto.

FIG. 1 is a front view of a display device 1 according to the first embodiment of the disclosure. Referring to FIG. 1, the display device 1 includes a plurality of pixels PU. The pixel PU may be composed of a plurality of sub-pixels P. The sub-pixels P may be arranged in an array to provide a display screen. For example, the pixels PU may include at least one red sub-pixel PR, at least one green sub-pixel PG, and at least one blue sub-pixel PB, but is not limited thereto. However, the color types of the plurality of sub-pixels P may be changed according to requirements. For example, the sub-pixels P may include sub-pixels with other colors, such as a white sub-pixel (not shown) or a yellow sub-pixel (not shown), but is not limited thereto.

In FIG. 1, the plurality of sub-pixels with the same color are arranged along, a first direction D1, but are not limited thereto. In the drawing, the sub-pixels showing the same bottom pattern are the sub-pixels with the same color. The sub-pixels with different colors (the red sub-pixel PR, the green sub-pixel PG, and the blue sub-pixel PB) are sequentially arranged along a second direction D2, but are not limited thereto. In some embodiments, the first direction D1 is different from the second direction D2. In some embodiments, the first direction D1 may be substantially perpendicular to the second direction D2, that is, an actuate angle θ between the first direction D1 and the second direction D2 is about 80 degrees to 90 degrees (80 degrees≤θ≤90 degrees). However, the arrangement of the sub-pixels P, the composition of the pixels PU, and/or the actuate angle θ between the first direction D1 and the second direction D2 may be changed according to requirements, and are not limited to as shown in FIG. 1.

Figure 2:
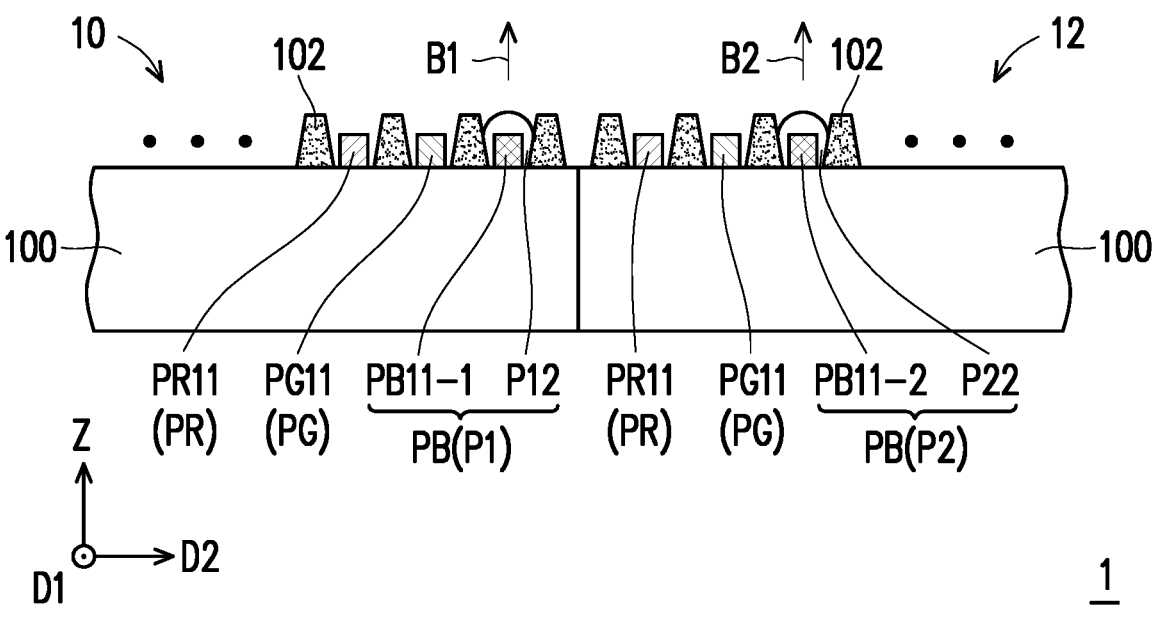
FIG. 2 is a partial cross-sectional view of the display device in FIG. 1 corresponding to a cross-sectional line I-I'.

FIG. 2 is a partial cross-sectional view of the display device 1 in FIG. 1 corresponding to a cross-sectional line I-I'. In FIG. 1 and FIG. 2, for simplicity of explanation, only a first sub-pixel P1 and a second sub-pixel P2 are described. However, the method for reducing the visibility of color difference (to be described later) of the disclosure may be applied to more than two sub-pixels with the same color. In FIG. 1 and FIG. 2, the first sub-pixel P1 and the second sub-pixel P2 are exemplified using the blue sub-pixel PB, but the disclosure is not limited to reduce the visibility of the blue color difference. For example, the method for reducing the visibility of color difference may reduce the visibility of color difference for the sub-pixels with any color of the plurality of sub-pixels.

FIG. 1 and FIG. 2 schematically illustrate a case where there is a color difference between at least two sub-pixels (including the first sub-pixel P1 and the second sub-pixel P2) with the same color in different display modules. Specifically, the display device 1 includes a first display module 10 and a second display module 12 tiled with the first display module 10, wherein the first sub-pixel P1 is in the first display module 10, and the second sub-pixel P2 is in the second display module 12, but are not limited thereto. In another embodiment, the first sub-pixel and the second sub-pixel may be two sub-pixels (the first sub-pixel P1 and a second sub-pixel P2' as shown in FIG. 1) with the same color at different locations in the same display module. In other words, the method for reducing the visibility of color difference may be used to reduce the visibility of at least two sub-pixels with the same color in different display modules, or to reduce the visibility of at least two sub-pixels with the same color in the same display module. The following embodiments may all be improved accordingly, which will not be reiterated hereafter.

Figure 3:
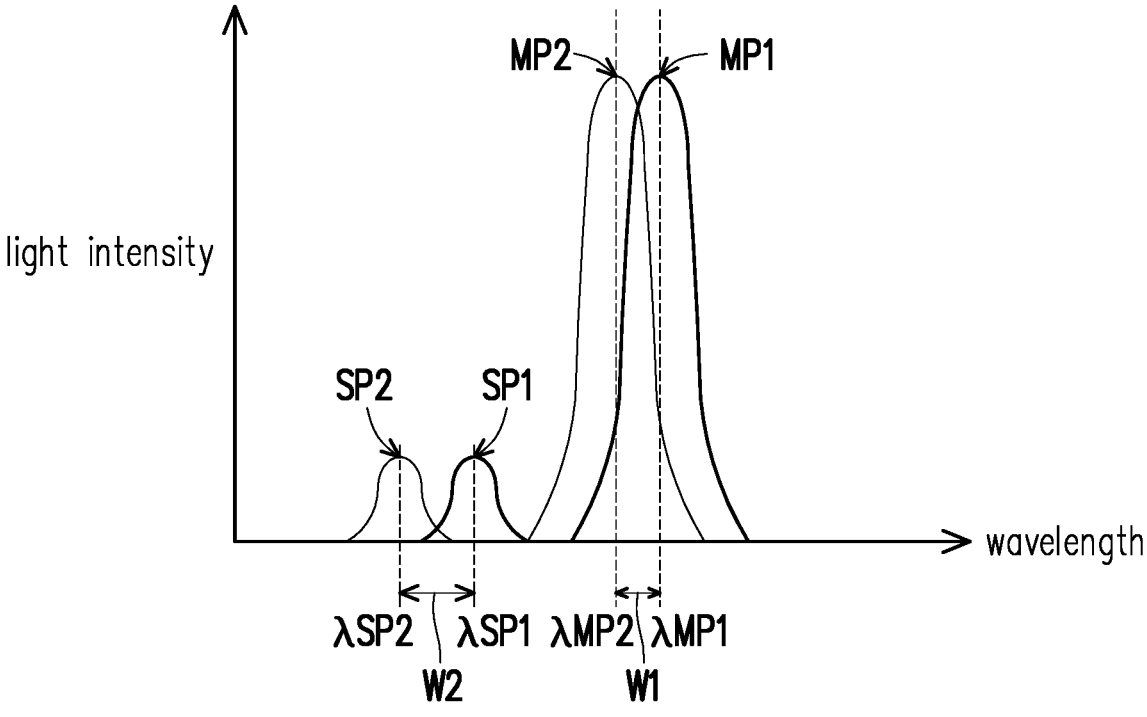
FIG. 3 is a spectrum diagram of a first light and a second light in FIG. 2.

Referring to FIG. 1 to FIG. 3, the first sub-pixel P1 includes a first light emitting unit PB11-1 and a first wavelength conversion layer (also referred to as "first optical portion") P12 disposed thereon. The first sub-pixel P1 is for providing a first light B1 emitted from the first light emitting unit PB11-1 and is converted by the wavelength conversion layer P12. The second sub-pixel P2 includes a second light emitting unit PB11-2 and a second wavelength conversion layer (also referred to as "second optical portion") P22 disposed thereon. The second sub-pixel P2 is for providing a second light B2 emitted from the second light emitting unit PB11-2 and is converted by the second wavelength conversion layer P22.

In detail, the first light emitting unit PB11-1 provides a first excitation light (not shown). The first wavelength conversion layer P12 converts the first excitation light into a first converted light (not shown). Finally, the first light B1 provided by the first sub-pixel P1 may include the first converted light and the unconverted first excitation light. Similarly, the second light emitting unit P21 provides a second excitation light (not shown). The second wavelength conversion layer P22 converts the second excitation light into a second converted light (not shown). Finally, the second light B2 provided by the second sub-pixel P2 may include the second converted light and the unconverted second excitation light. In the embodiment (FIG. 1 and FIG. 3), the first sub-pixel P1 and the second sub-pixel P2 are the blue sub-pixels PB. Therefore, the first light B1 and the second light B2 are blue light, but are not limited thereto. In other embodiments (not shown), the first sub-pixel P1 and the second sub-pixel P2 are sub-pixels with other colors (such as the red sub-pixels PR, the green sub-pixels PG or sub-pixels of other suitable colors), and the first sub-pixel P1 and the second sub-pixel P2 need to have substantially the same color.

In some embodiments, the wavelength conversion layer may cover the light emitting unit. In some embodiments, the wavelength conversion layer may or may not contact the light emitting unit. In some embodiments, other film layer and/or element may be disposed between the wavelength conversion layer and the light emitting unit. In some embodiments (refer to FIG. 8), the wavelength conversion layer (such as the first wavelength conversion layer P12 or the second wavelength conversion layer P22) and the corresponding light emitting unit (such as the first light emitting unit PB11-1 or the second light emitting unit PB11-2) may be respectively disposed on the same or different substrates (such as an array substrate 100 and a substrate 200). For details, refer to the descriptions of FIG. 8 in the following.

In some embodiments, the first light emitting unit P11 and/or the second light emitting unit P21 may include a LED, an OLED, a micro LED, a mini LED or a quantum dot LED (abbreviated as QLED or QD-LED).

In some embodiments, the wavelength conversion layer (such as the first wavelength conversion layer P12 and the second wavelength conversion layer P22) may include a single layer or multilayer structure. In some embodiments, the wavelength conversion layer includes an active layer. The material of the active layer may include fluorescence, phosphor, quantum dot (QD), other suitable materials or at least a combination thereof. In some embodiments, the active layer may be excited by a short-wavelength light (or short-wavelength light beam) and convert the short-wavelength light (or short-wavelength light beam) into a long-wavelength light (or long-wavelength light beam), but is not limited thereto. In some embodiments, the first wavelength conversion layer P12 and/or the second wavelength conversion layer P22 include at least one protective layer (not shown in FIG. 1 to FIG. 3) and/or at least one filter layer (not shown in FIG. 1 to FIG. 3). In other words, the first wavelength conversion layer P12 and/or the second wavelength conversion layer P22 may include a stacked layer of an active layer, at least one protective layer and/or at least one filter layer.

FIG. 3 is a spectrum diagram of the first light B1 and the second light B2 in FIG. 2. In FIG. 3, the thick solid lines and the thin solid lines schematically represent the spectrums of the first light B1 and the second light B2 respectively. Referring to FIG. 2 and FIG. 3, the first light B1 includes a first main-peak MP1 and a first sub-peak SP1. The first main-peak MP1 is substantially the first converted light converted by the first wavelength conversion layer P12 from a portion of the first excitation light emitted by the first light emitting unit PB11-1, and the first sub-peak SP1 is substantially a portion of the first excitation light not converted by the first wavelength conversion layer P12, but are not limited thereto. The first wavelength conversion layer P12 is excited by the first excitation light (for example, the short-wavelength light), and the first excitation light be converted into the first converted light (the long-wavelength light). Therefore, a wavelength $\lambda MP1$ of the first main-peak MP1 is greater than a wavelength $\lambda SP1$ of the first sub-peak SP1.

Similarly, the second light B2 includes a second main-peak MP2 and a second sub-peak SP2. The second main-peak MP2 is substantially the second converted light converted by the second wavelength conversion layer P22 from a portion of the second excitation light emitted by the second light emitting unit PB11-2, and the second sub-peak SP2 is substantially a portion of the second excitation light not be converted by the second wavelength conversion layer P22. The second wavelength conversion layer P22 is excited by the second excitation light (the short-wavelength light), and the second excitation light be converted into the second converted light (the long-wavelength light). Therefore, a wavelength $\lambda MP2$ of the second main-peak MP2 is greater than a wavelength $\lambda SP2$ of the second sub-peak SP2.

It should be noted that, the spectrum of the first light B1 includes the first main-peak MP1 and the first sub-peak SP1, and the first main-peak MP1 may have the wavelength $\lambda MP1$. In other words, the wavelength $\lambda MP1$ may be the wavelength corresponding to the maximum light intensity in the spectrum of the first light B1. The spectrum of the second light B2 comprises the second main-peak MP2 and the second sub-peak SP2, and the second main-peak MP2 may have the wavelength $\lambda MP2$. In other words, the wavelength $\lambda MP2$ is the wavelength corresponding to the maximum light intensity in the spectrum of the second light B2. In addition, the first sub-peak SP1 may have the wavelength $\lambda SP1$, and the second sub-peak SP2 may have the wavelength $\lambda SP2$.

In addition, in some embodiments, when the first light B1 and the second light B2 are blue light, the wavelengths of the first sub-peak SP1 and the second sub-peak SP2 may be in a range of 390 nm to 460 nm (390 nm≤SP1 (SP2)≤460 nm), or the first sub-peak SP1 and the second sub-peak SP2 are in a range of 400 nm to 450 nm (400 nm≤SP1 (SP2)≤450 nm), but are not limited thereto. The wavelengths of the first main-peak MP1 and the second main-peak MP2 may be in a range of 460 nm to 470 nm (460 nm≤MP1 (MP2)≤470 nm), but are not limited thereto.

In some embodiments, when the first light and the second light are red light, the wavelengths of the first sub-peak and the second sub-peak may be in a range of 390 nm to 460 nm (390 nm≤SP1 (SP2)≤460 nm), for example, the wavelengths of the first sub-peak and the second sub-peak may be in a range of 400 nm to 450 nm (400 nm≤SP1 (SP2)≤450 nm), but are not limited thereto. The wavelengths of the first main-peak and the second main-peak may be in a range of 600 nm to 700 nm (600 nm≤MP1 (MP2)≤700 nm), but are not limited thereto.

In some embodiments, when the first light and the second light are green light, the wavelengths of the first sub-peak and the second sub-peak may be in a range of 390 nm to 460 nm (390 nm≤SP1 (SP2)≤460 nm), for example, the wavelengths of the first sub-peak and the second sub-peak may be in a range of 400 nm to 450 nm (400 nm≤SP1 (SP2)≤450 nm), but are not limited thereto. The wavelengths of the first main-peak and the second main-peak may be in a range of 500 nm to 600 nm (500 nm≤MP1 (MP2)≤600 nm), but are not limited thereto.

In some embodiments, as shown in FIG. 3, there is a first wavelength difference W1 (that is, the difference between the wavelength $\lambda MP1$ and the wavelength $\lambda MP2$) between the first main-peak MP1 and the second main-peak MP2, and there is a second wavelength difference W2 (that is, the difference between the wavelength $\lambda SP1$ and the wavelength $\lambda SP2$) between the first sub-peak SP1 and the second sub-peak SP2, wherein the first wavelength difference W1 is less than 20 nm and the first wavelength difference W1 is less than the second wavelength difference W2 between the first sub-peak SP1 and the second sub-peak SP2. In other words, the first wavelength difference W1 being less than the second wavelength difference W2 means that the color difference between the first converted light and the second converted light formed by color-conversion is less than the color difference between the first excitation light and the second excitation light before color-conversion. By disposing the wavelength conversion layer, the color difference (wavelength difference) between at least two (or more) sub-pixels in the sub-pixels with the same color may be reduced, or to increase the display quality. In an embodiment, the first wavelength difference W1 may be greater than or equal to 0 nm and less than or equal to 2 nm (0 nm≤first wavelength difference W1≤2 nm), making it difficult for the human eyes to detect the color difference. In addition, in some embodiments, a ratio of the first wavelength difference W1 to the second wavelength difference W2 may be in a range of 0.2 to 0.8 (0.2≤W1/W2≤0.8).

In addition, by disposing the wavelength conversion layer, a short-wavelength (wavelength in a range of 400 nm to 450 nm) excitation light may be converted into a long-wavelength (wavelength in a range of 460 nm to 470 nm) converted light that meets the international color gamut standard BT.2020 (also referred to as Rec. 2020) published by the International Telecommunication Union Radiocommunication Sector (ITU-R), but is not limited thereto. In addition, compared with blue light having a wavelength in a range of 400 nm to 450 nm, blue light having a wavelength in a range of 460 nm to 470 nm is less likely to harm the eyes, or to increase the comfort of the viewer when viewing the display screen. In an embodiment, a filter layer (not shown in FIG. 1 to FIG. 3, the method of configuring the filter layer will be described in detail in the following) may be configured to absorb at least a portion of the excitation light for reducing the light intensity of the first sub-peak SP1 and the light intensity of the second sub-peak SP2 in FIG. 3, or to improve the display quality.

Please refer to FIG. 1 and FIG. 2, the red sub-pixel PR may include a light emitting unit PR11, and the light emitting unit PR11 may emit red light (not shown), the green sub-pixel PG may include a light emitting unit PG11, and the light emitting unit PG11 may emit green light (not shown), and the blue sub-pixel PB may include light emitting units (for example, a first light emitting unit PB11-1 and a second light emitting unit PB11-2) and the light emitting units (for example, the first light emitting unit PPB11-1 and the second light emitting unit PB11-2) may emit blue light (not shown). In the embodiment of FIG. 1 to FIG. 3, the first sub-pixel P1 and the second sub-pixel P2 are the blue sub-pixels PB, but are not limited thereto. In addition, the red sub-pixel PR, the green sub-pixel PG, and/or the other blue sub-pixel PB may selectively include or not include the wavelength conversion layer. The material of the wavelength conversion layer will be adjusted according to the sub-pixel of the corresponding color.

According to different requirements, the display device 1 may comprise at least one display module. For example, the display device 1 may include a first display module 10 and a second display module 12. The first display module 10 and the second display module 12 may respectively include an array substrate 100, a plurality of light emitting units PR11 emitting red light, a plurality of light emitting units PG11 emitting green light, and/or a plurality of light emitting units (the first light emitting unit PB11-1 and/or the second light emitting unit PB11-2) emitting blue light. The light emitting unit PR11, the light emitting unit PG11 and/or the light emitting unit (the first light emitting unit PB11-1 and/or the second light emitting unit PB11-2) are disposed on the array substrate 100. In some embodiments, the array substrate 100 may include a substrate (not shown), and an active element array (not shown) and peripheral circuits (not shown) disposed on the substrate. However, for the drawings to be clearer, the array substrate 100 is illustrated as flat. References may be made to the prior art for the relevant descriptions of the active element array substrate, which will not be further limited/described here.

In some embodiments (as shown in FIG. 2), the display device 1 may include a first light shielding structure 102. The first light shielding structure 102 is, disposed on the array substrate 100. In some embodiments (as shown in FIG. 2), the first light shielding structure 102 is adjacent to or surrounding the first light emitting unit PB11-1 and the second light emitting unit PB11-2. In detail, viewing in a normal direction Z (that is, the top view direction of the display device 1) of the array substrate 100, the shape of the first light shielding structure 102 may be in a grid shape, and the first light shielding structure 102 is adjacent to or surrounds the plurality of light emitting units (including the light emitting unit PR11, the light emitting unit PG11, the first light emitting unit PB11-1, and/or the second light emitting unit PB11-2). In some embodiments, the material of the first light shielding structure 102 may include an opaque material, a light absorbing material, a light reflecting material or a combination thereof, but is not limited thereto. In some embodiments, the first light shielding structure 102 includes a black resin and/or a metal material, but is not limited thereto. The first light shielding structure 102 is used as a black matrix (BM).

Figure 4:
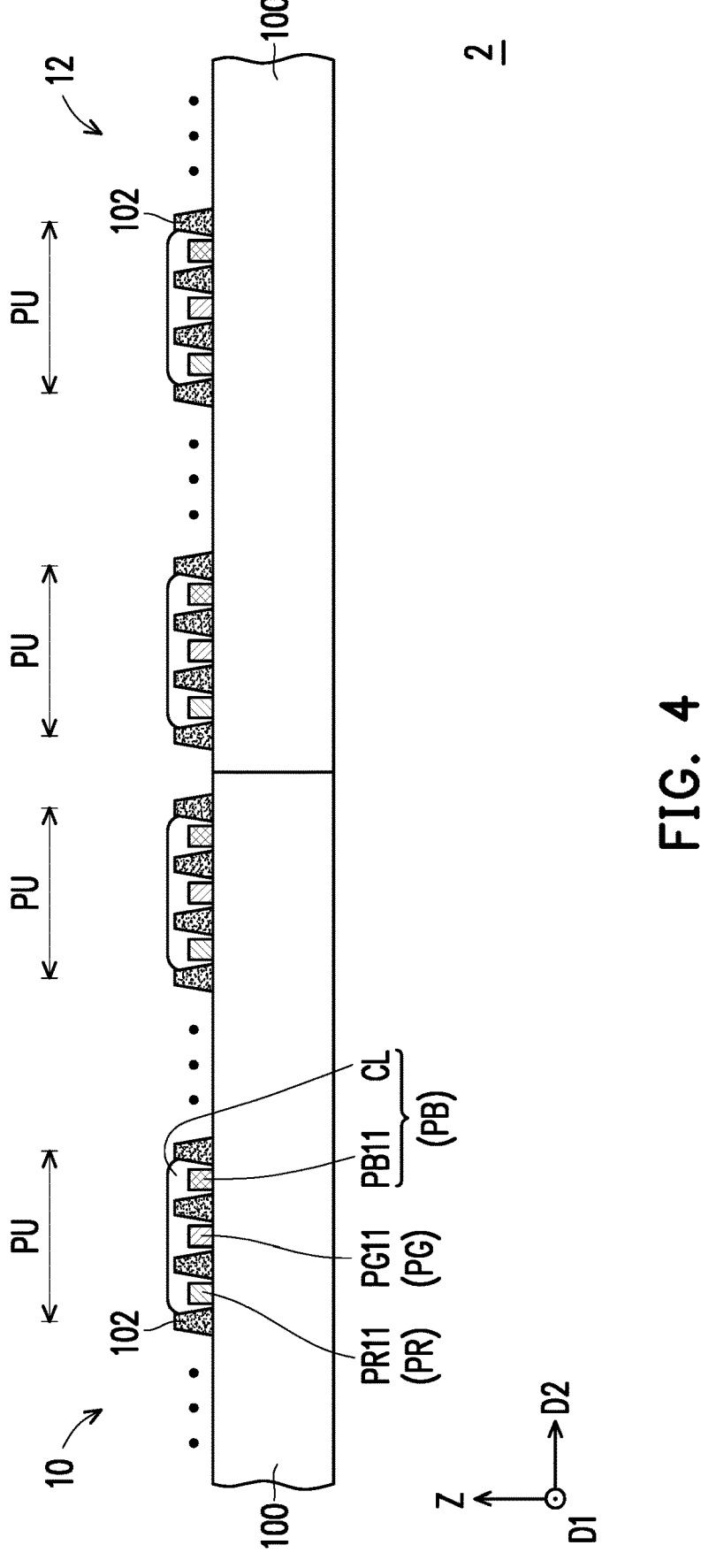
FIG. 4 to FIG. 10 are respectively partial cross-sectional views of display devices according to the second embodiment to the eighth embodiment of the disclosure.

FIG. 4 to FIG. 10 are partial cross-sectional views of display devices 2 to 8 according to the second embodiment to the eighth embodiment of the disclosure. Referring to FIG. 4, the main differences between the display device 2 and the display device 1 in FIG. 2 are described in the following. In the display device 2, a wavelength conversion layer CL is disposed in at least one pixel PU. For example, the wavelength conversion layer CL is disposed on a plurality of light emitting units located in the same pixel PU. In some embodiments (as shown in FIG. 4), the wavelength conversion layer CL is disposed on light emitting units (including a light emitting unit PB11 emitting blue light, a light emitting unit PG11 emitting green light and/or a light emitting unit PR11 emitting red light) with different colors, but is not limited thereto. In some embodiments (as shown in FIG. 4), the wavelength conversion layer CL covers the light emitting units (including the light emitting unit PB11 emitting blue light, the light emitting unit PG11 emitting green light, and the light emitting unit PR11 emitting red light) with different colors. In some embodiments (as shown in FIG. 4), the wavelength conversion layer CL may be further disposed on at least a portion of a first light shielding structure 102. In some embodiments (as shown in FIG. 4), in the cross-sectional direction, the upper surface of the wavelength conversion layer CL may have a curved shape.

Figure 5:
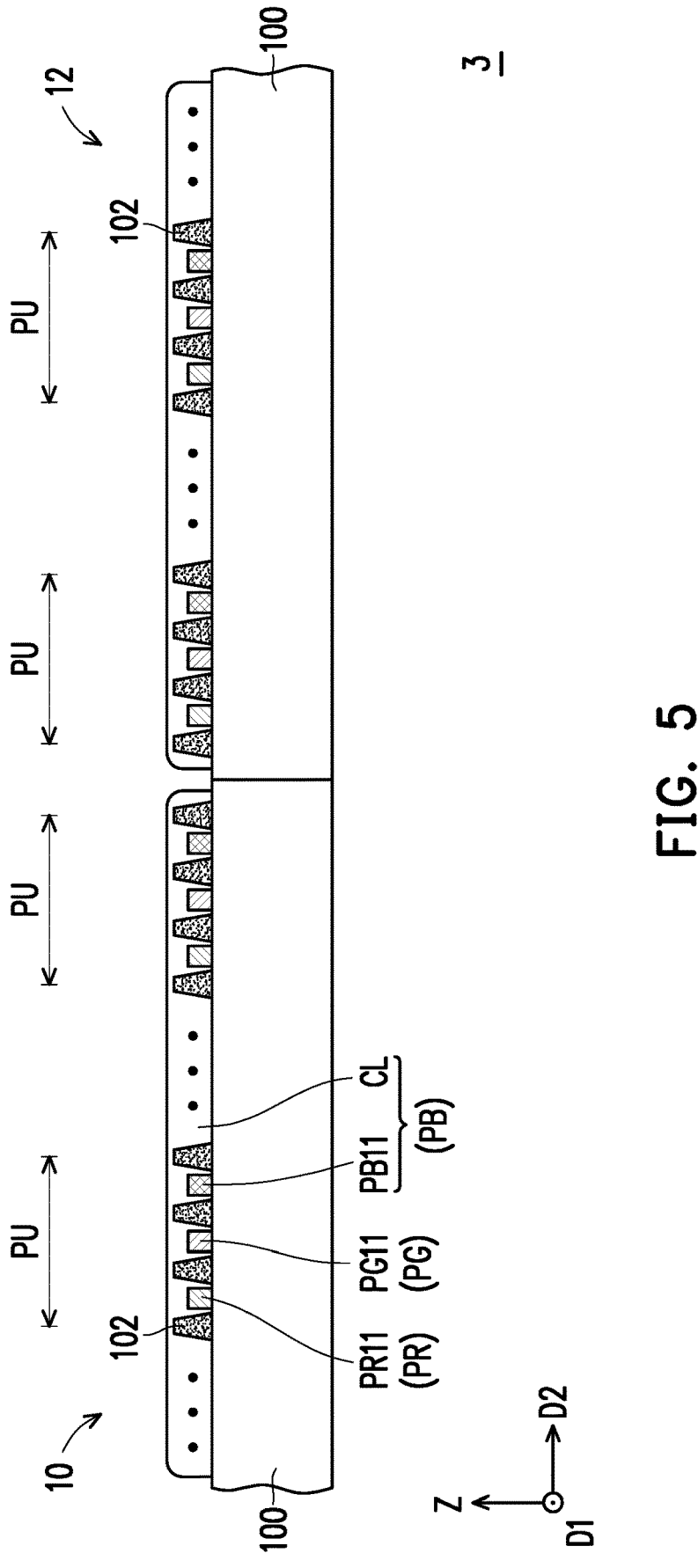

Referring to FIG. 5, the main differences between the display device 3 and the display device 2 in FIG. 4 are described in the following. In the display device 3, a wavelength conversion layer CL is disposed on light emitting units of a plurality of pixels PU. In some embodiments (as shown in FIG. 5), the wavelength conversion layer CL is disposed on the light emitting units of all the pixels PU in a first display module 10 (or a second display module 12). In some embodiments (as shown in FIG. 5), the wavelength conversion layer CL covers the light emitting units of all the pixels PU in the first display module 10 (or the second display module 12). In some embodiments (as shown in FIG. 5), the wavelength conversion layer CL may be disposed on a first light shielding structure 102.

Figure 6:
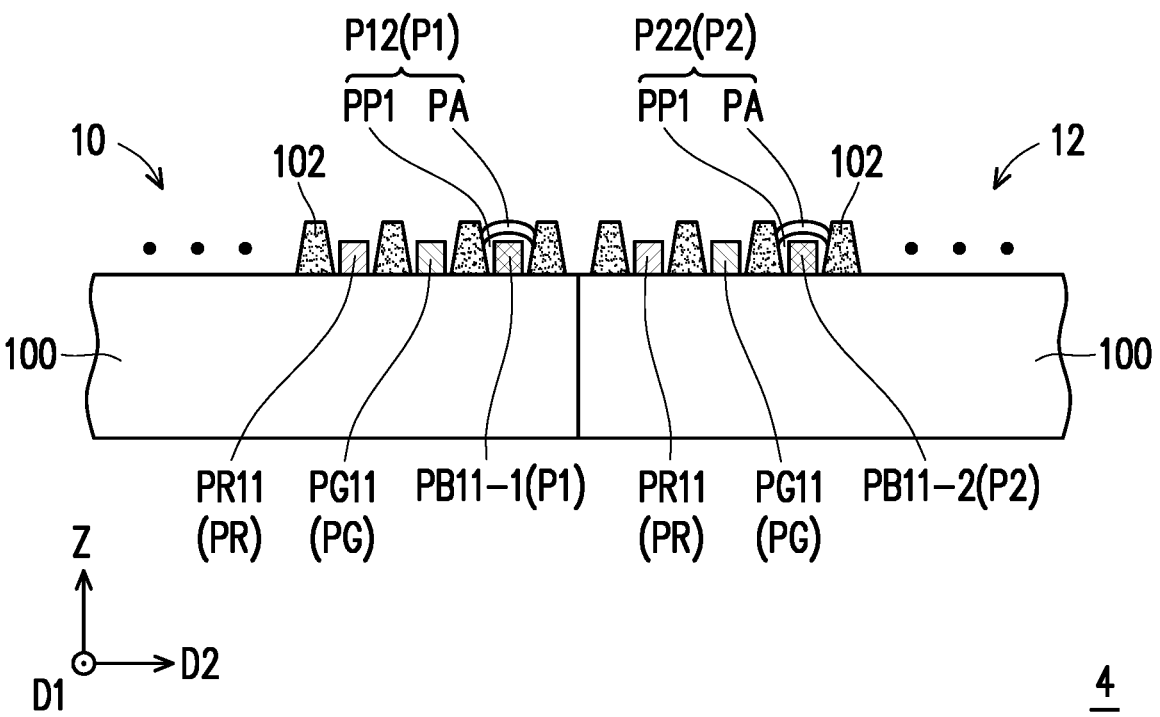

Referring to FIG. 6, the main differences between the display device 4 and the display device 1 in FIG. 2 are described in the following. In the display device 4, a first wavelength conversion layer P12 and/or a second wavelength conversion layer P22 may include an active layer PA and a first protective layer PP1. In some embodiments (as shown in FIG. 6), the first protective layer PP1 is disposed between a first light emitting unit PB11-1 (and/or a second light emitting unit PB11-2) and the active layer PA. The first protective layer PP1 may be used to separate the light emitting unit (such as the first light emitting unit PB11-1 or the second light emitting unit PB11-2) from the active layer PA to reduce the influence of heat generated by the light emitting unit on the active layer PA, such as the influence of the light emitting characteristic of the active layer PA, but is not limited thereto. In some embodiments, the first protective layer PP1 includes a transparent material, a moisture-proof material, other suitable materials or a combination thereof, but is not limited thereto. For example, the material of the first protective layer PP1 may include epoxy, acrylic-based resin, silicone, polyimide polymer or a combination thereof, but is not limited thereto. In some embodiments, the material of the active layer PA may include fluorescent, phosphorescent, QD, other suitable materials or a combination thereof, but is not limited thereto. In addition, the wavelength conversion layer CL in other drawings (for example, FIG. 4 and FIG. 5) may also selectively include the first protective layer PP1 and the active layer PA.

Figure 7:
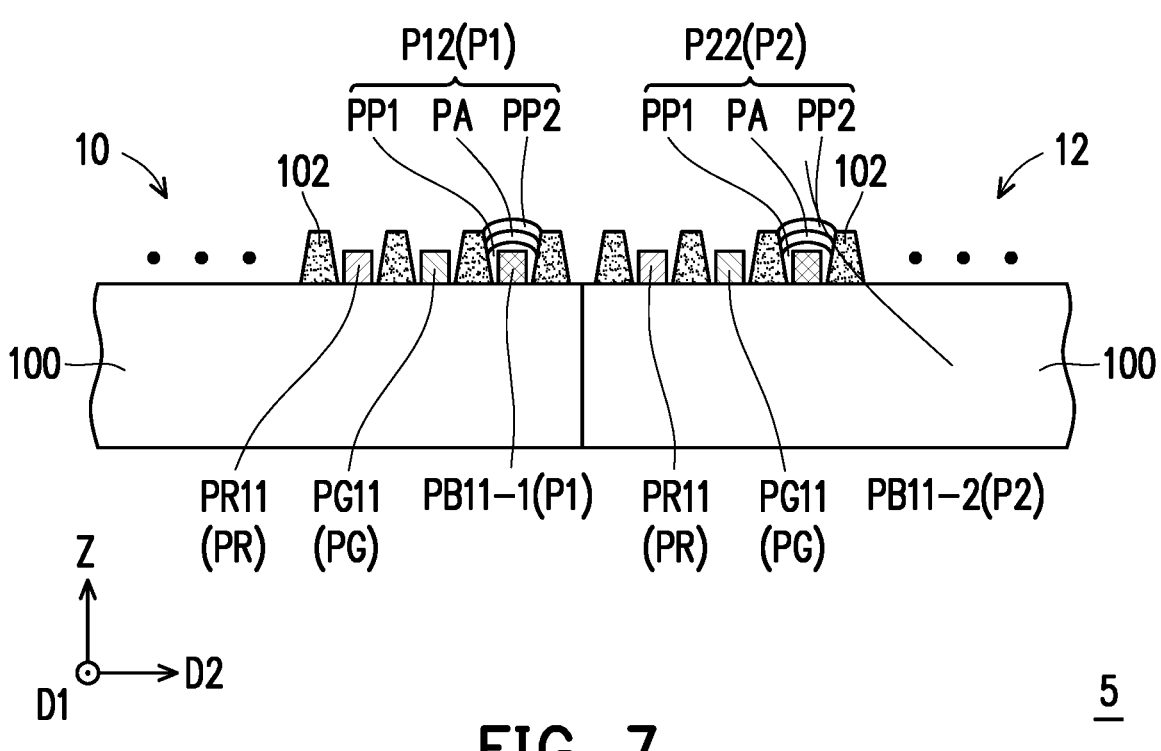

Referring to FIG. 7, the main differences between the display device 5 and the display device 4 in FIG. 6 are described in the following. In the display device 5, a first wavelength conversion layer P12 and/or a second wavelength conversion layer P22 may further comprise a second protective layer PP2. The second protective layer PP2 is disposed on an active layer PA. Alternatively, the second protective layer PP2 covers the active layer PA. As shown in FIG. 7, the active layer PA is disposed between a first protective layer PP1 and the second protective layer PP2. The second protective layer PP2 may be used to separate the active layer PA from the external environment for reducing the influence of air and/or water vapor in the external environment to the active layer PA. In some embodiments, the second protective layer PP2 includes, for example, a transparent material, a moisture-proof material, other suitable materials or a combination thereof, but is not limited thereto. For example, the material of the second protective layer PP2 may include epoxy, acrylic-based resin, silicone, polyimide polymer, etc., but is not limited thereto. In some embodiments, the materials of the first protective layer PP1 and the second protective layer PP2 may be the same or different. In some embodiments, the first protective layer PP1 and/or the second protective layer PP2 may be a single layer structure or a multilayer structure. The wavelength conversion layer CL in other drawings (for example, FIG. 4 and FIG. 5) may selectively include the first protective layer PP1, the active layer PA, and/or the second protective layer PP2.

Figure 8:
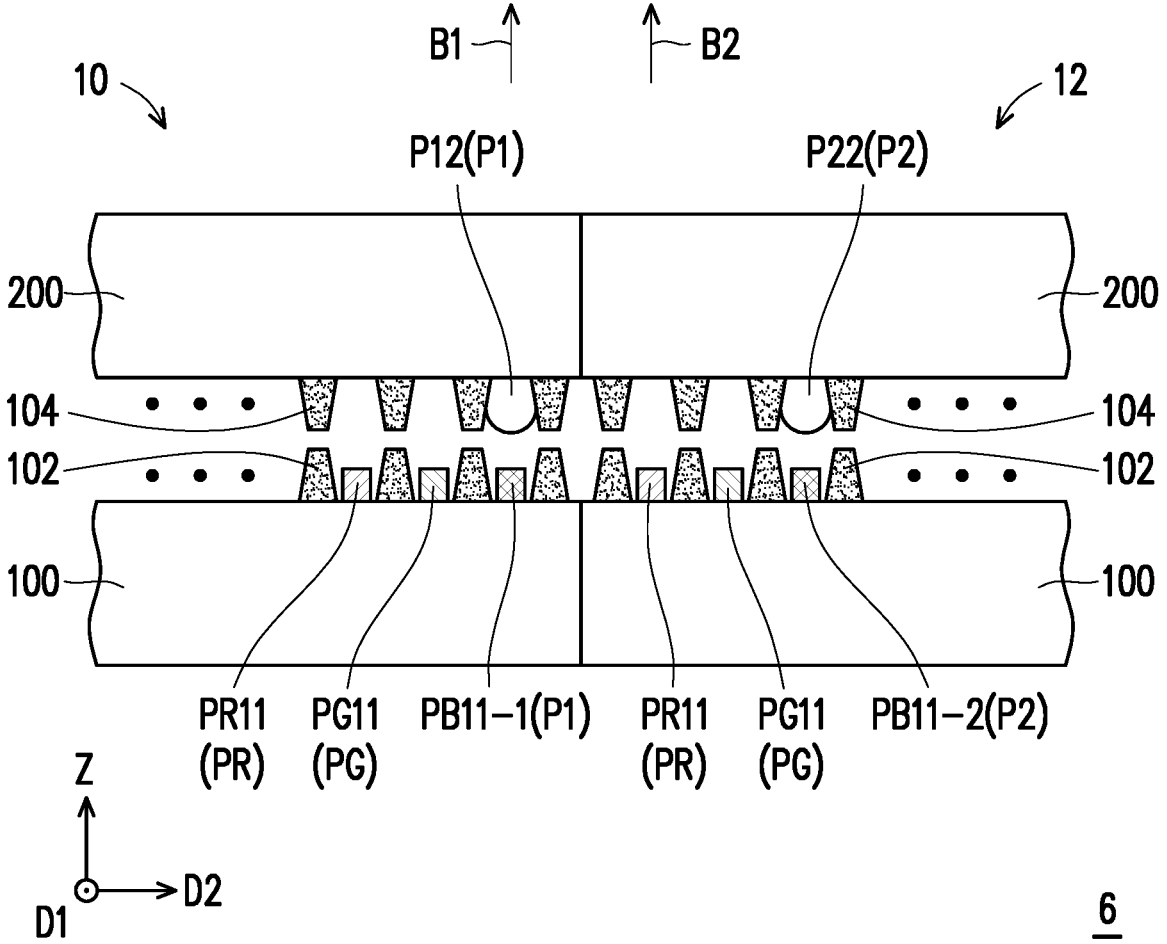

Referring to FIG. 8, the main differences between the display device 6 and the display device 1 in FIG. 2 are described in the following. The display device 6 includes a first light shielding structure 102 and a second light shielding structure 104. As shown in FIG. 8, in a first display module 10 and/or a second display module 12, the second light shielding structure 104 is disposed on the first light shielding structure 102. In some embodiments (as shown in FIG. 8), the first light shielding structure 102 overlaps with the second light shielding structure 104 in a normal direction Z of an array substrate 100 (or a top view direction of the display device 6). In some embodiments (as shown in FIG. 8), the first light shielding structure 102 and the second light shielding structure 104 are respectively disposed or formed on different substrates. The first light shielding structure 102 is disposed or formed on the array substrate 100, and the second light shielding structure 104 is disposed or formed on a substrate 200, wherein the substrate 200 is disposed opposite to the array substrate 100. In some embodiments (as shown in FIG. 8), the wavelength conversion layer (including a first wavelength conversion layer P12 and/or a second wavelength conversion layer P22) is disposed on the substrate 200, and the second light shielding structure 104 is disposed on the substrate 200 and surrounds the first wavelength conversion layer P12 and/or the second wavelength conversion layer P22, but are not limited thereto. In some embodiments (as shown in FIG. 8), the first wavelength conversion layer P12 may be disposed on a first light emitting unit PB11-1 and may not contact the first light emitting unit PB11-1, and the second wavelength conversion layer P22 may be disposed on a second light emitting unit PB11-2, and the second wavelength conversion layer P22 may not contact the second light emitting unit PB11-2. In some embodiments, the first light shielding structure 102 and the second light shielding structure 104 may contact or not contact each other. In some embodiments, the area of the first light shielding structure 102 projected on the array substrate 100 may be the same as or different from the area of the second light shielding structure 104 projected on the array substrate 100. In some embodiments, the material of the first light shielding structure 102 and the material of the second light shielding structure 104 may be the same or different. In some embodiments, the thickness of the first light shielding structure 102 and the thickness of the second light shielding structure 104 may be the same or different in a normal direction Z of the array substrate 100. In some embodiments, in the cross-sectional direction, the appearance of the first light shielding structure 102 and the appearance of the second light shielding structure 104 may be the same or different. In some embodiments, a fixing element including an adhesive material may be disposed between the substrate 200 and the array substrate 100, but is not limited thereto.

Figure 9:
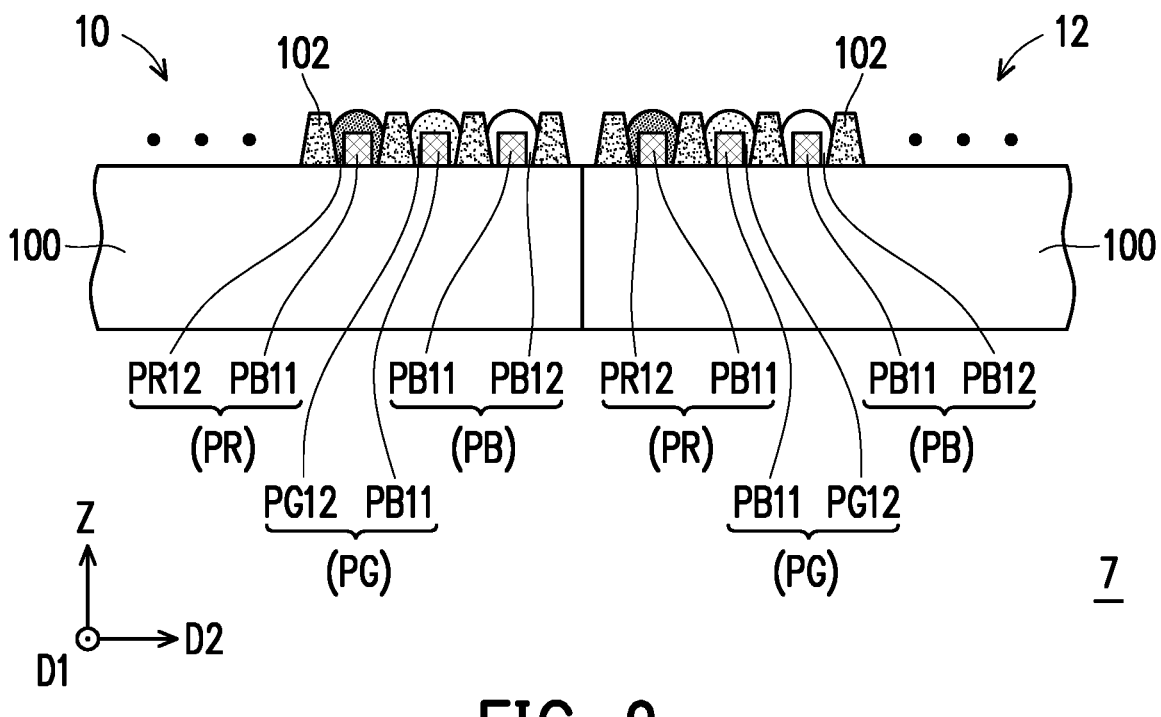

Referring to FIG. 9, the main differences between the display device 7 and the display device 1 in FIG. 2 are described in the following. In the display device 7, a blue light emitting unit PB11 is included in a red sub-pixel PR, a green sub-pixel PG, and/or a blue sub-pixel PB. In some embodiments, the blue light emitting unit PB11 shown in FIG. 9 may be replaced by other suitable light emitting units, such as a UV light emitting unit, but is not limited thereto. In addition, the red sub-pixel PR further includes a wavelength conversion layer PR12. The wavelength conversion layer PR12 is disposed on the blue light emitting unit PB11. The wavelength conversion layer PR12 may convert at least a portion of blue light emitted by the blue light emitting unit PB11 into red light. In addition, the green sub-pixel PG further includes a wavelength conversion layer PG12. The wavelength conversion layer PG12 is disposed on the blue light emitting unit PB11. The wavelength conversion layer PG12 may convert at least a portion of blue light emitted by the blue light emitting unit PB11 into green light. In addition, the blue sub-pixel PB further includes a wavelength conversion layer PB12. The wavelength conversion layer PB12 is disposed on the blue light emitting unit PB11. The wavelength conversion layer PB12 may convert at least a portion of blue light emitted by the blue light emitting unit PB11 into blue light having other wavelength band, such as converting blue light having a short wavelength into blue light having a long wavelength, but is not limited thereto.

Figure 10:
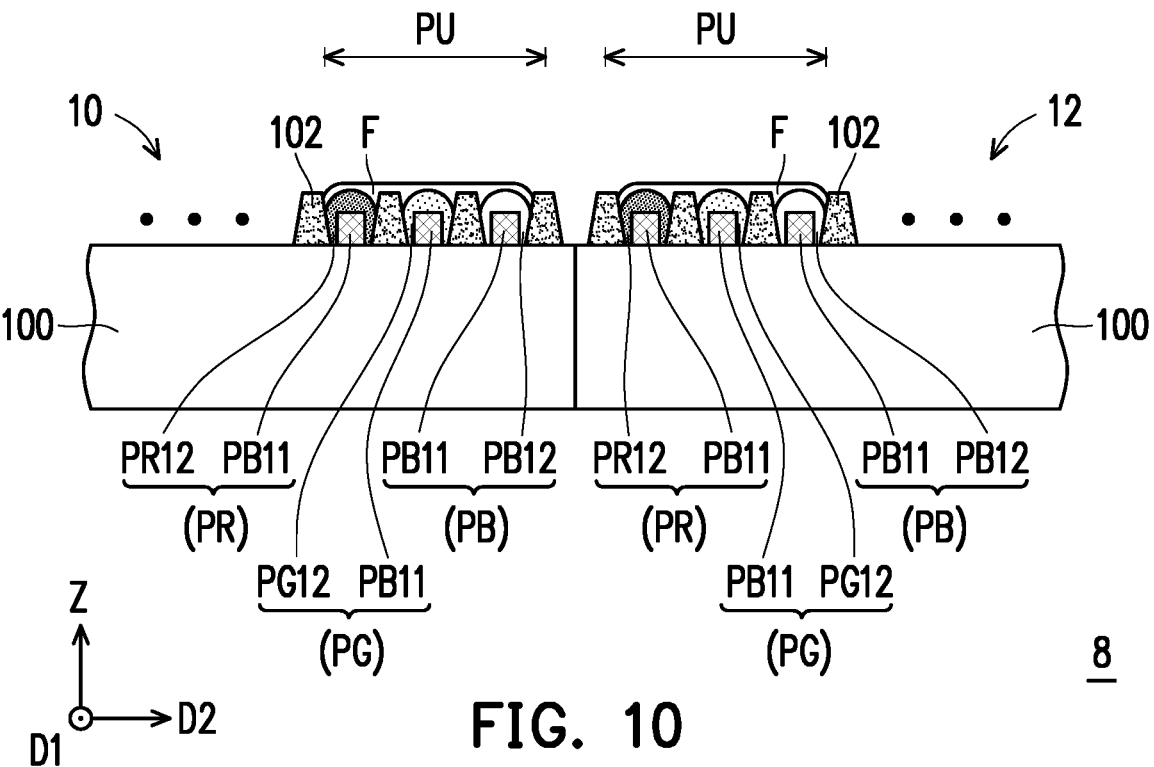

Referring to FIG. 10, the main differences between the display device 8 and the display device 7 in FIG. 9 are described in the following. The display device 8 includes a filter layer F. The filter layer F is disposed on a wavelength conversion layer (including a wavelength conversion layer PR12, a wavelength conversion layer PG12, a wavelength conversion layer PB12 and/or a wavelength conversion layer CL). The wavelength conversion layer may be compared with the first wavelength conversion layer (P12) or the second wavelength conversion layer (P22). The wavelength band filtered by the filter layer F may be designed according to requirements. For example, the filter layer F may be used to reduce the intensity of light having the wavelength at the first sub-peak and/or the second sub-peak. The filter layer may be used to increase the chance of the excitation light emitted by the light emitting unit being filtered out. For example, the filter layer F may be used to increase the chance of blue light (such as blue light having a short wavelength) emitted by a blue light emitting unit PB11 being filtered out. In some embodiments (as shown in FIG. 10), the filter layer F may cover the wavelength conversion layer (including the wavelength conversion layer PG12, the wavelength conversion layer PR12, the wavelength conversion layer PB12 and/or the wavelength conversion layer CL) in a pixel PU. In another embodiment (not shown), at least one sub-pixel or all sub-pixels in a display module may share one filter layer F, that is, the filter layer F may be disposed on the light emitting unit of at least one sub-pixel or the light emitting units of all the sub-pixels. In some embodiments (not shown), the filter layer F may cover the light emitting unit of at least one sub-pixel or the light emitting units of all the sub-pixels. In some embodiments (not shown), a plurality of filter layers F may be respectively disposed on light emitting units of a plurality of sub-pixels. In some embodiments (not shown), the thickness of the filter layer F corresponding to light emitting units of sub-pixels with different colors may be different, and the thickness of the filter layer F corresponding to light emitting units of sub-pixels with different colors may be adjusted according to the degree of filtering required by the different sub-pixels. In another embodiment (not shown), the wavelength conversion layer may include at least one active layer, at least one protective layer, and/or at least one filter layer. In an embodiment, the active layer, the protective layer, and/or the filter layer may be a single layer or multilayer material. In some embodiments (not shown), the active layer (may refer to FIG. 8) may be disposed between the filter layer F and the light emitting unit PB11 in a normal direction Z of an array substrate 100, but is not limited thereto. In some embodiments (refer to FIG. 6 or FIG. 7), a protective layer PP1 is disposed between a light emitting unit and an active layer PA. In some embodiments (not shown), a protective layer PP2 may be disposed between the active layer PA and the filter layer F, but is not limited thereto. In some embodiments (as shown in FIG. 10), the filter layer may be further disposed on at least a portion of a first light shielding structure 102. In some embodiments (as shown in FIG. 10), in the cross-sectional direction, the upper surface of the wavelength conversion layer CL may have a curved shape.

In summary, in the embodiments of the disclosure, the wavelength conversion layer is respectively disposed in the plurality of sub-pixels with the same color (the wavelength difference between the main-peaks is less than 20 nm) to reduce the color difference (wavelength difference) between the plurality of sub-pixels with the same color. Therefore, the display device according to the embodiments of the disclosure can reduce the visibility of color difference, or improving the display quality. In an embodiment, a portion of the excitation light may be absorbed or filtered by the filter layer, thereby reducing the light intensity of the sub-peak, or to improving the display quality of the display device. In another embodiment, the wavelength conversion layer may be a single-layer active layer or a stacked layer including other functional layer (for example, at least one protective layer and/or at least one filter layer).

The above embodiments are only used to explain the technical solution of the disclosure, but not to limit the disclosure. Although the disclosure has been described in detail with reference to the foregoing embodiments, persons skilled in the art should understand that modifications may be made to the technical solution recited in the foregoing embodiments or replacements may be made to some or all the equivalent technical features. These modifications or replacements do not make the essence of the corresponding technical solution to depart from the scope of the technical solution of the embodiments.

Although the embodiments and advantages of the disclosure have been disclosed as above, it should be understood that persons skilled in the art may make changes, replacements, and modifications without departing from the spirit and scope of the disclosure. In addition, the scope of protection of the disclosure is not limited to the process, machine, manufacturing, substance composition, device, method, and steps described in the specific embodiments of the specification. Any persons skilled in the art may understand the current or future development of the process, machine, manufacturing, substance composition, device, methods, and steps from the disclosure, as long as substantially the same functions may be implemented or substantially the same results may be obtained in the embodiments described herein, they may be used according to the disclosure. Therefore, the scope of protection of the disclosure includes the processe, machine, manufacturing, substance composition, device, method, and steps. In addition, each claim constitutes a separate embodiment and the scope of protection of the disclosure also includes combinations of various claims and embodiments. The scope of protection of the disclosure shall be determined by the scope of the appended claims.

What is claimed is:

1. A display device, comprising:
a first light emitting unit;
a first optical portion disposed on the first light emitting unit, wherein a light emitting from the first light emitting unit at least passes through the first optical portion is a first light, and the first light comprises a first main-peak;
a second light emitting unit;
a second optical portion disposed on the second light emitting unit, wherein a light emitting from the second light emitting unit at least passes through the second optical portion is a second light, and the second light comprises a second main-peak;
wherein a first wavelength difference between the first main-peak and the second main-peak is less than 20 nm, and the first light and the second light are same color light,
wherein a wavelength of the first main-peak is more than or equal to 600 nm and less than or equal to 700 nm, and a wavelength of the second main-peak is more than or equal to 600 nm and less than or equal to 700 nm.

2. The display device according to claim 1, wherein at least one of the first optical portion and the second optical portion comprises a filter layer.

3. The display device according to claim 1, wherein at least one of the first optical portion and the second optical portion comprises a fluorescence, a phosphor, or a quantum dot.

4. The display device according to claim 1, wherein the first wavelength difference between the first main-peak and the second main-peak is less than 2 nm.

5. The display device according to claim 1, wherein the first light and the second light are blue light, green light or red light.

6. The display device according to claim 1, further comprising a liquid crystal layer.

7. A display device, comprising:
a first light emitting unit;
a first optical portion disposed on the first light emitting unit, wherein a light emitting from the first light emitting unit at least passes through the first optical portion is a first light, and the first light comprises a first main-peak;

a second light emitting unit;

a second optical portion disposed on the second light emitting unit, wherein a light emitting from the second light emitting unit at least passes through the second optical portion is a second light, and the second light comprises a second main-peak;

wherein a first wavelength difference between the first main-peak and the second main-peak is less than 20 nm, and the first light and the second light are same color light, wherein a wavelength of the first main-peak is more than or equal to 460 nm and less than or equal to 470 nm, and a wavelength of the second main-peak is more than or equal to 460 nm and less than or equal to 470 nm.

8. A display device, comprising:

a first light emitting unit;

a first optical portion disposed on the first light emitting unit, wherein a light emitting from the first light emitting unit at least passes through the first optical portion is a first light, and the first light comprises a first main-peak;

a second light emitting unit;

a second optical portion disposed on the second light emitting unit, wherein a light emitting from the second light emitting unit at least passes through the second optical portion is a second light, and the second light comprises a second main-peak;

wherein a first wavelength difference between the first main-peak and the second main-peak is less than 20 nm, and the first light and the second light are same color light, wherein a wavelength of the first main-peak is more than or equal to 500 nm and less than or equal to 600 nm, and a wavelength of the second main-peak is more than or equal to 500 nm and less than or equal to 600 nm.

* * * * *